United States Patent
Kanter et al.

(10) Patent No.: US 12,260,129 B2
(45) Date of Patent: Mar. 25, 2025

(54) TRACKING AND UPDATING READ COMMAND VOLTAGE THRESHOLDS IN SOLID-STATE DRIVES

(71) Applicant: Kioxia Corporation, Tokyo (JP)

(72) Inventors: Ofir Kanter, Haifa (IL); Avi Steiner, Haifa (IL)

(73) Assignee: KIOXIA CORPORATION, Tokyo (JP)

( * ) Notice: Subject to any disclaimer, the term of this patent is extended or adjusted under 35 U.S.C. 154(b) by 41 days.

(21) Appl. No.: 18/124,407

(22) Filed: Mar. 21, 2023

(65) Prior Publication Data

US 2024/0319875 A1   Sep. 26, 2024

(51) Int. Cl.
| | | |
|---|---|---|
| G06F 3/06 | (2006.01) | |
| G06F 11/10 | (2006.01) | |
| G11C 11/56 | (2006.01) | |
| G11C 16/04 | (2006.01) | |
| G11C 16/26 | (2006.01) | |

(52) U.S. Cl.
CPC ............ *G06F 3/0679* (2013.01); *G06F 3/061* (2013.01); *G06F 3/0659* (2013.01); *G06F 11/1068* (2013.01); *G11C 11/5642* (2013.01); *G11C 11/5671* (2013.01); *G11C 16/0483* (2013.01); *G11C 16/26* (2013.01)

(58) Field of Classification Search
CPC ......... G11C 16/10; G11C 16/12; G11C 16/14; G11C 16/26; G11C 16/28; G11C 16/0483; G11C 16/5642; G11C 16/5671; G11C 29/021; G11C 29/42; G11C 29/44; G11C 29/52; G06F 11/076; G06F 11/0727; G06F 11/1068; G06F 3/061; G06F 3/0659; G06F 3/0679
See application file for complete search history.

(56) References Cited

U.S. PATENT DOCUMENTS

| | | | | |
|---|---|---|---|---|
| 2019/0066802 | A1* | 2/2019 | Malshe | ............... G11C 29/52 |
| 2020/0364103 | A1* | 11/2020 | Sharifi Tehrani | ... G06F 11/0727 |
| 2021/0193229 | A1* | 6/2021 | Liikanen | ............. G11C 29/021 |

* cited by examiner

*Primary Examiner* — Shelly A Chase
(74) *Attorney, Agent, or Firm* — Foley & Lardner LLP

(57) ABSTRACT

Disclosed herein are related to a system and a method for adjusting a read voltage threshold to read data from a plurality of memory dies of a nonvolatile memory device. Each of the plurality of memory dies comprises a plurality of blocks. A controller in communication with the plurality of memory dies may read, from a first block of the plurality of blocks, data corresponding to a read command received from a host. The controller may determine a bit error rate for the first block based on the data. The controller may update the read voltage threshold for the first block when the bit error rate for the first block exceeds a first error threshold. The read voltage threshold may be stored in the controller.

20 Claims, 15 Drawing Sheets

902
Read, from a first block of the plurality of blocks, data corresponding to a read command received from a host, 904
Determine a bit error rate for the first block based on the data, and 906
Update the read command voltage threshold for the first block when the bit error rate for the first block exceeds a first error threshold, the read command voltage threshold being stored in the controller

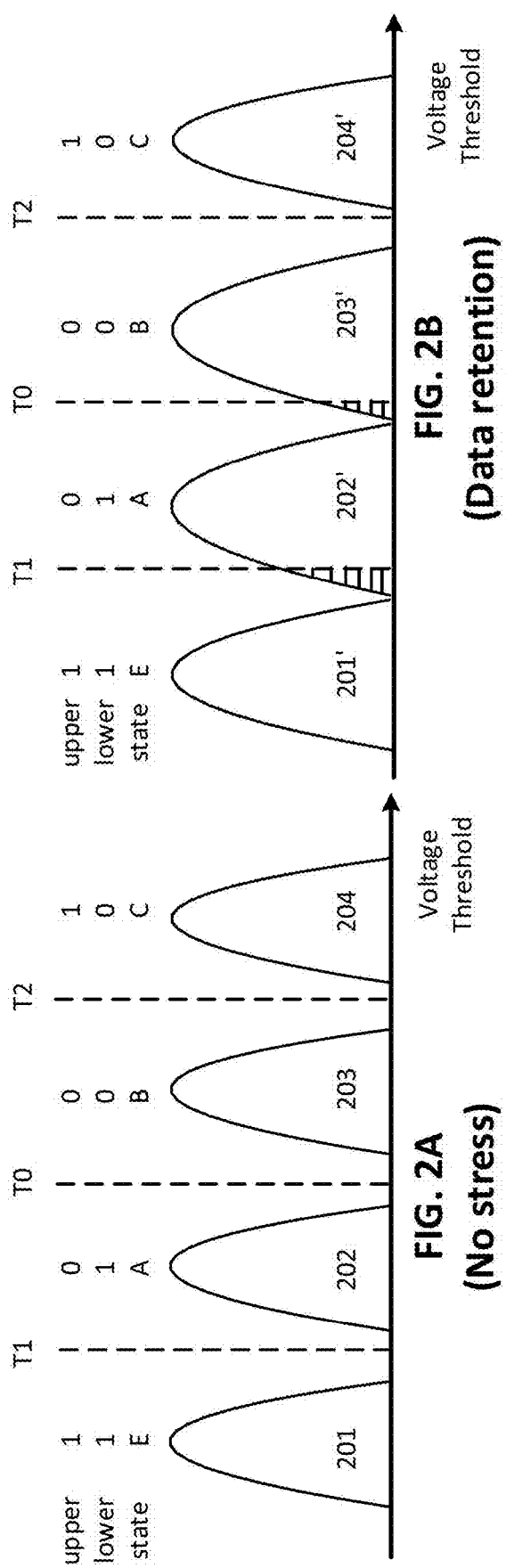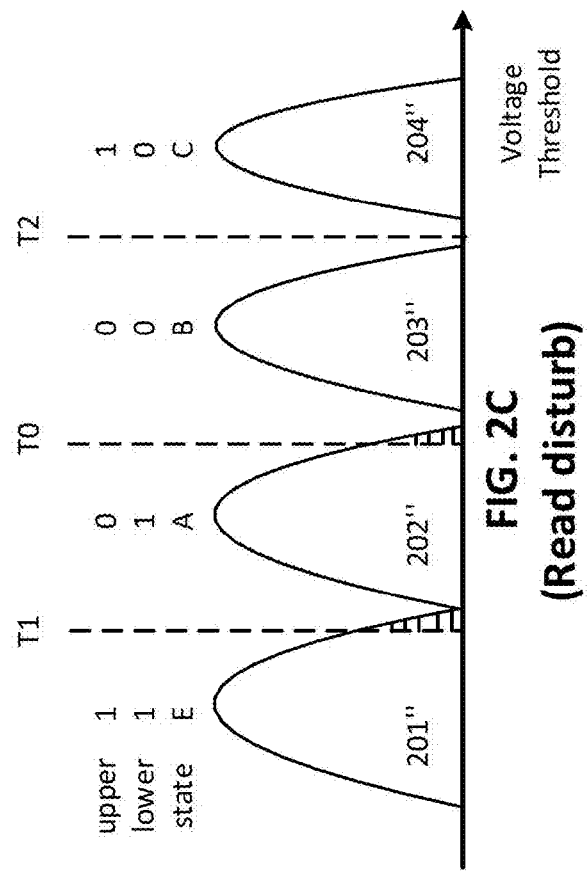

302

| Device | Block | Index |
|---|---|---|
| 0 | 0 | 0 |
| 0 | 1 | 1 |
| 0 | 2 | 2 |
| 0 | 3 | 3 |
| 0 | 4 | 4 |
| 0 | 5 | 5 |
| 0 | 6 | 6 |
| 0 | 7 | 7 |
| 1 | 0 | 8 |
| 1 | 1 | 9 |
| 1 | 2 | 10 |
| 1 | 3 | 11 |
| 1 | 4 | 12 |
| 1 | 5 | 13 |
| 1 | 6 | 14 |
| 1 | 7 | 15 |
| 2 | 0 | 16 |
| 2 | 1 | 17 |
| 2 | 2 | 18 |
| 2 | 3 | 19 |
| 2 | 4 | 20 |
| 2 | 5 | 21 |
| 2 | 6 | 22 |
| 2 | 7 | 23 |
| 3 | 0 | 24 |
| 3 | 1 | 25 |
| 3 | 2 | 26 |
| 3 | 3 | 27 |
| 3 | 4 | 28 |
| 3 | 5 | 29 |
| 3 | 6 | 30 |
| 3 | 7 | 31 |

History Table

| content |
|---|
| 5 |
| 12 |
| 1 |
| 8 |
| 15 |
| 15 |
| 11 |
| 8 |
| 13 |
| 6 |
| 5 |
| 8 |
| 5 |
| 8 |
| 8 |
| 4 |
| 6 |
| 2 |
| 13 |
| 6 |
| 12 |
| 10 |
| 11 |
| 9 |
| 15 |
| 9 |
| 6 |
| 5 |
| 2 |
| 0 |
| 8 |
| 0 |

| Index |
|---|
| 0 |
| 1 |
| 2 |
| 3 |
| 4 |
| 5 |
| 6 |
| 7 |
| 8 |
| 9 |
| 10 |
| 11 |
| 12 |
| 13 |
| 14 |
| 15 |

LUT-3 (Code Book Table)

| TH-0 | TH-1 | TH-2 |
|---|---|---|
| 900 | 2900 | 4900 |
| 912 | 2914 | 4908 |
| 921 | 2925 | 4920 |
| 932 | 2933 | 4931 |
| 946 | 2944 | 4936 |
| 961 | 2955 | 4949 |
| 966 | 2969 | 4954 |
| 981 | 2984 | 4965 |
| 991 | 2994 | 4977 |
| 998 | 3002 | 4985 |
| 1012 | 3012 | 4993 |
| 1026 | 3021 | 4999 |
| 1031 | 3035 | 5012 |
| 1040 | 3040 | 5036 |
| 1045 | 3047 | 5035 |
| 1052 | 3052 | 5050 |

FIG. 3B

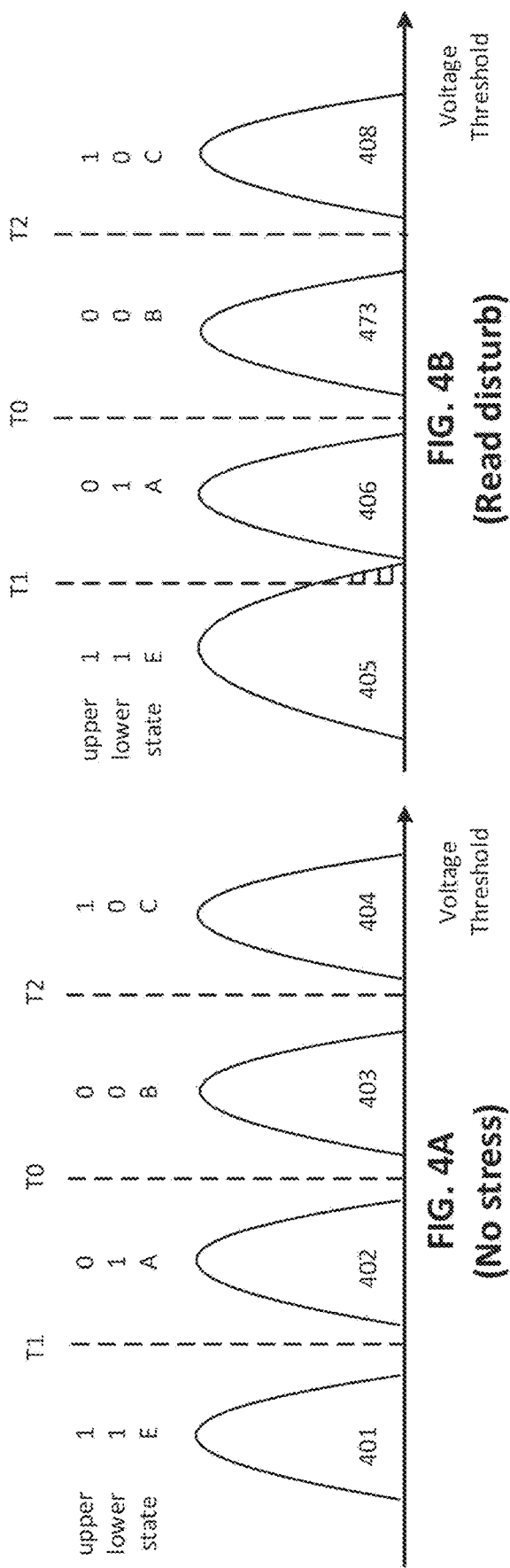

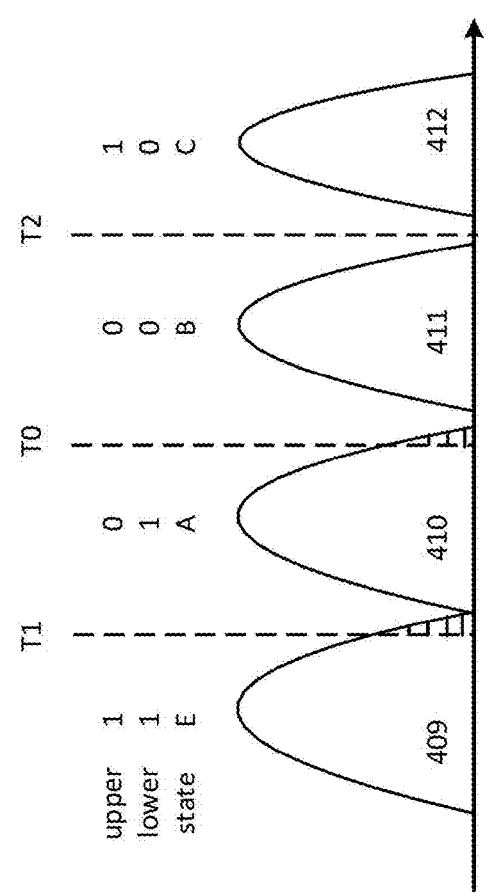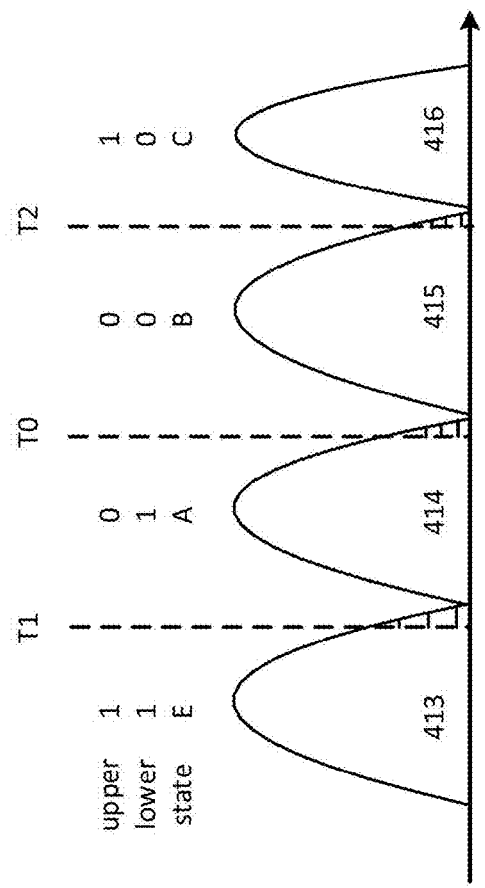

(Data retention)

(Data retention)

(Data retention)

(Data retention)

(Data retention)

(Data retention)

| | | | Stress Impact | | | | ECC Statistical Observations | | | | Offset Values | | |
| | | | Lower | Upper | | Lower Page | | Upper Page | | | | |
| | Example | Stress | T0 | T1 | T2 | BER | $P_0 \leftrightarrow P_1$ | BER | $P_0 \leftrightarrow P_1$ | $\Delta T_0$ | $\Delta T_1$ | $\Delta T_2$ |
|---|---|---|---|---|---|---|---|---|---|---|---|---|
| | FIG. | | | | | | | | | | | |
| 509 | 4B | RD | None | 1→0 | None | L | ∅ | H | $P_0 > P_1$ | 0 | 1 | 0 |
| 511 | 4C | RD | 1→0 | 1→0 | None | H | $P_0 > P_1$ | H | $P_0 > P_1$ | 1 | 1 | 0 |
| 513 | 4D | RD | 1→0 | 1→0 | 0→1 | H | $P_0 > P_1$ | H | $P_0 > P_1$ | 1 | 1 | 1 |
| 515 | 4E | DR | 0→1 | 0→1 | None | H | $P_0 < P_1$ | H | $P_0 < P_1$ | -1 | -1 | 0 |
| 517 | 4F | DR | 0→1 | 0→1 | 1→0 | H | $P_0 < P_1$ | H | $P_0 < P_1$ | -1 | -1 | -1 |
| 519 | 4G | DR | None | 0→1 | None | L | ∅ | H | $P_0 < P_1$ | 0 | -1 | 0 |

FIG. 5

TRACKING AND UPDATING READ COMMAND VOLTAGE THRESHOLDS IN SOLID-STATE DRIVES

FIELD

The present disclosure relates to solid-state drives (SSDs) and methods for tracking and updating read voltage thresholds to ensure successful read commands and improve system performance.

BACKGROUND

Systems based on multi-level cell (MLC) NAND devices provide high performance with high endurance. In such systems, the MLC NAND device includes two bits per cell, and read commands are typically executed using default read voltage thresholds. Such default thresholds provide bit error rates (BERs) that are easily fixed by error correcting code (ECC).

However, such systems are subject to failure in the event of severe stresses, including data retention stress or read disturb stress. Data retention stress is caused by long periods of time that elapse between programming operations of an MLC NAND device and subsequent read operations from the device. During such periods, data that was stored on a flash page is gradually lost due to electron detrapping. This causes leakage of charge out of the memory cell, and, as such, the voltage level of each cell gradually decreases. In other words, data retention stresses thus cause the voltage distributions corresponding to particular MLC states to shift to lower voltages. As a consequence of such shifting, erroneous data may be read.

Read disturb stress is caused by large read operations from the same page of an MLC NAND device. During such a read operation, a high pass-through voltage is sent to every memory cell that shares a bit line with the cell being read. Despite the fact that, in general, such pass-through voltages are smaller in magnitude than programming voltages, they still generate a weak programming effect in the cells to which they are applied. As a consequence, the voltage level of each affected cell gradually increases. In other words, read disturb stresses thus cause the voltage distributions corresponding to particular MLC states to shift to higher voltages. Cells that were, prior to experiencing the pass-through voltage, in an "erase" state (as described further below) are particularly susceptible to such increases in voltage. As a consequence of such shifting, erroneous data may be read.

When SSDs are subject to such stresses, the BER for a given read operation may be too high to be corrected by ECC implementations. In such cases, a read-retry flow is invoked in order to re-read the page for which the error occurred with a different read-threshold. Invocation of such retry flows results in performance degradation and, ideally, are avoided.

SUMMARY

According to an embodiment of the present disclosure, there is provided a method for adjusting a read voltage threshold used to read data from a plurality of memory dies of a nonvolatile memory device, each of the memory dies comprising a plurality of blocks, and the method performed by a controller of the nonvolatile memory device in communication with the memory dies. The method comprises reading, from a first block of the plurality of blocks, data corresponding to a read command received from a host. The method also includes determining a bit error rate for the first block based on the data. Additionally, the method comprises updating the read voltage threshold for the first block when the bit error rate for the first block exceeds a first error threshold, the read voltage threshold being stored in the controller.

According to another embodiment of the present disclosure, there is provided a nonvolatile memory device comprising a plurality of memory dies. Each of the memory dies comprises a plurality of blocks. The nonvolatile memory device further comprises a controller coupled to the plurality of memory dies. The controller is configured to read, from a first block of the plurality of blocks, data corresponding to a read command received from a host. The controller is also configured to determine a bit error rate for the first block based on the data. The controller is further configured to update a read voltage threshold for the first block when the bit error rate for the first block exceeds a first error threshold.

In some implementations, the controller of a nonvolatile memory device determines a bit error rate for each of an upper page and a lower page of the first block. In certain implementations, the controller reads a codeword from the first block of the plurality of blocks and decodes the codeword via error-correcting code (ECC) to determine the bit error rate for the first block. In further implementations, the controller updates the read voltage threshold stored in the controller by calculating an offset voltage to add to the read voltage threshold. In some implementations, the controller is further configured to store the read voltage threshold in a codebook in the controller. In certain implementations, the codebook is accessible by a lookup table stored within the controller. In further implementations, the controller is further configured to determine a bit error rate for at least a second block of the plurality of blocks. In some implementations, the controller stored ECC statistics for the first block and the second block. In certain implementations, the controller updates a read voltage threshold stored in the controller for the second block when the bit error rate for the second block exceeds a second error threshold. In further implementations, the memory dies of the nonvolatile memory device are multi-level cell (MLC) NAND memory dies.

These embodiments obviate the need to invoke burdensome retry flows because the read threshold is adjusted to change in accordance with the stress. When stress in the SSD increases over time, the tracking mechanisms described herein shift the read threshold accordingly. This allows future NAND reads (having updated read thresholds) to provide lower input BERs, which improves system performance and prevents long-term degradation.

BRIEF DESCRIPTION OF DRAWINGS

The foregoing and other objects and advantages will be apparent upon consideration of the following detailed description, taken in conjunction with the accompanying drawings, in which like reference characters refer to like parts throughout, and in which:

FIGS. 2A-2C illustrate exemplary voltage threshold distributions in MLC NAND cells subject to no stress, data retention stress, and read disturb stress;

FIGS. 3A and 3B illustrate a history table and a code book table (together a "code book") for use in the read voltage threshold updating and tracking methods according to one or more embodiments of the disclosure;

FIGS. 4A-4G illustrate the effect of various stresses on an exemplary read voltage threshold distribution;

FIG. 5 illustrates a table containing stress impacts, ECC statistics, and offset values for the stress cases of FIGS. 4B-4G according to one or more embodiments of the disclosure;

DETAILED DESCRIPTION

To provide an overall understanding of the devices described herein, certain illustrative embodiments will be described. Although the embodiments and features described herein are specifically described for use in connection with a solid-state drive (SSD) having a controller, it will be understood that all the components and other features outlined below may be implemented in a variety of fashions in either hardware or firmware of an SSD in any suitable manner, and may be adapted and applied to other types of SSD architectures having a similar need to avoid burdensome read retry flows caused by executing read commands based on a default threshold. Further, all of the components and other features outlined below may be implemented in other types of nonvolatile memory devices, including universal flash storage (UFS) devices or secure digital (SD) card devices.

The present disclosure provides a method for tracking a threshold voltage used to read data from a NAND device by a controller of an SSD, and for updating the threshold voltage in the event that the data read from the NAND device has a corresponding bit error rate (BER) that exceeds some threshold. By tracking and updating the threshold voltage, burdensome read retry flows are avoided, system degradation is prevented, and system performance overall is improved.

As explained herein, the threshold tracking mechanism exploits the relationship between MLC NAND flash characteristics and different stress conditions. In particular, the failed bit count (FBC) results of ECC in the upper and lower pages of MLC NAND flash and stress type and magnitude are correlated. The tracking mechanism uses this correlation, as well as ECC decoding statistics of pages that have already been read and decoded in a standard, functional read flow, to estimate new read-thresholds. Such thresholds can be estimated, optimized, and adjusted to yield a BER that can be corrected by ECC, so that retry flows are not invoked. The read threshold tracking/adaptation mechanism and BER estimation method are simple and effective, and can be implemented both in hardware or firmware.

Implementation of such tracking mechanisms can be done with zero overhead: no additional buffer or NAND reads are required, as the statistics on which the estimations are based are gathered contemporaneously with the issued functional read commands. The tracking mechanisms described herein improve system performance and enable working with a higher endurance, as occurrences read-retry events followed by reading pages with default read-thresholds are reduced). The result is optimized quality of service (QOS) and continuous, successful hard-decoding due to the matching of stresses and thresholds.

Figure 1:
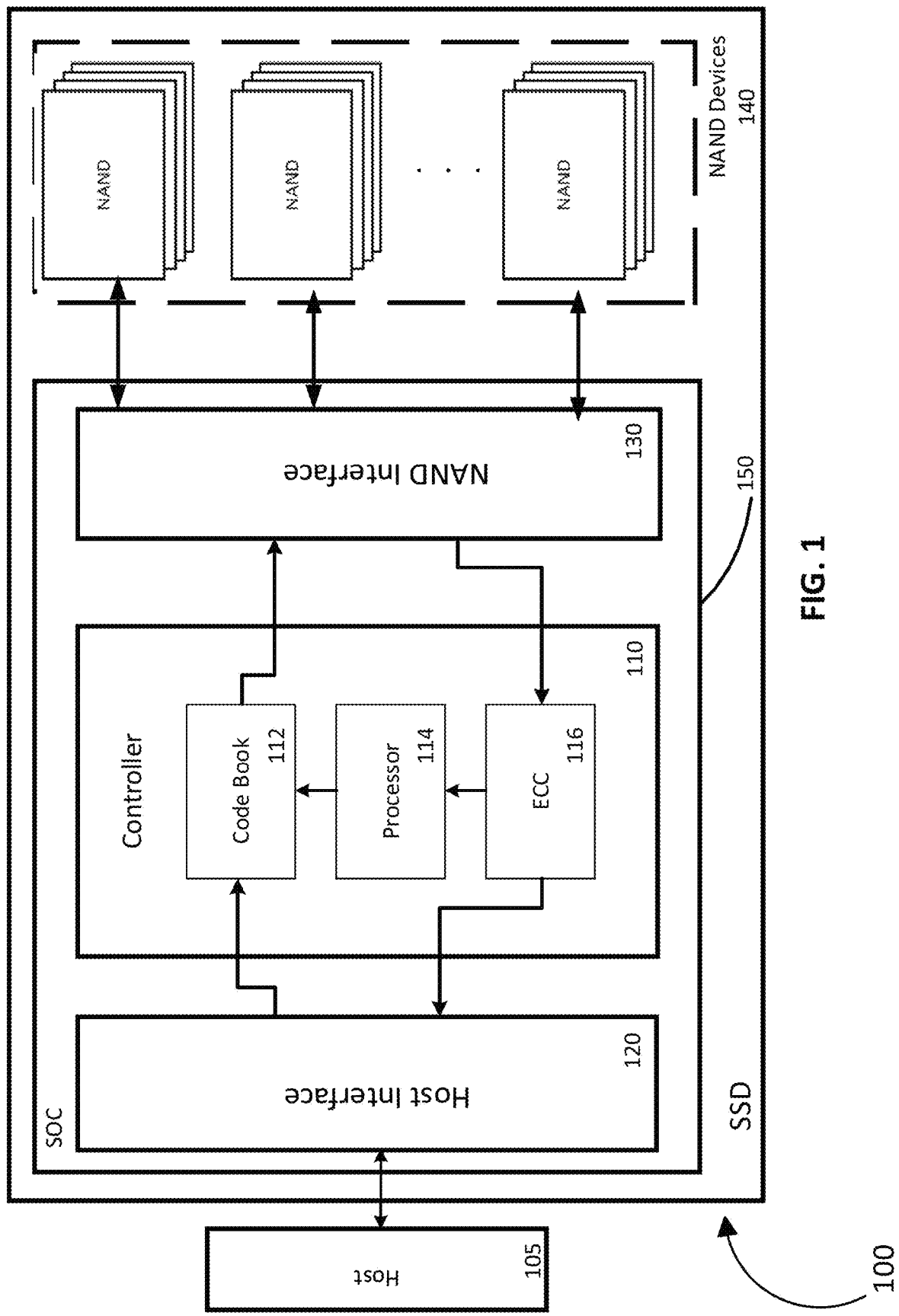
FIG. 1 illustrates a schematic representation of an SSD, configured according to one or more embodiments of the present disclosure.

FIG. 1 is a block diagram of a memory system comprising an SSD 100 in communication with a host 105. The host 105 may be a computing system that comprises processors, memories, and other components as generally known in the art. Such components of the host 105 are not illustrated in FIG. 1 for the sake of brevity. SSD 100 may communicate with host 105 via a host interface 120. SSD 100 may further comprise a controller 110, which itself may comprise a codebook 112, a processor 114, and an ECC module 116. Codebook 112 is, in some embodiments, a data structure in which information regarding read voltage thresholds is accessed, stored, and updated as described herein. Codebook 112 may be embodied as a storage component on controller 110, or may be implemented as a component of processor 114. ECC module 116 is, in some embodiments, a component of controller 110 configured to implement ECC on the codewords read from NAND devices 140 of SSD 100. ECC module 116 provides statistics on the BERs of the blocks of the NAND devices 140, as ascertained from the results of the ECC applied to the codewords read therefrom. ECC module 116 may be implemented as hardware, software, or as a combination of both hardware and software. Controller 110 is configured to track the threshold voltages used to execute read commands received from host 105, and, in some embodiments, is further configured to update the threshold voltages based on the block BER statistics determined by ECC module 116.

Controller 110 communicates via NAND interface 130 with a plurality of nonvolatile memory devices 140. While FIG. 1 shows that SSD 100 comprises NAND devices 140, other nonvolatile memory devices could be implemented in SSD 100 without loss of generality.

Controller 110, host interface 120, and NAND interface 130 may be implemented as a system-on-a-chip (SoC). SoCs are advantageous as they provide a single integrated circuit that contains all of the circuitry and components of the electronic system for SSD 100 to function.

FIGS. 2A-2C represent illustrative voltage threshold distributions used to read data from multi-level cell (MLC) NAND devices with four programmable states. As described above, NAND devices subject to stress, including data retention ("DR") stress and read disturb ("RD") stress are subject to failure. In particular, and as shown in the illustrative distributions of FIGS. 2A-2C, the voltage thresholds used to read data from particular pages of MLC blocks may shift in response to stress. This shifting in voltage threshold leads errors.

FIG. 2A demonstrates an exemplary voltage threshold distribution used to read data from an MLC NAND device in the absence of stress. FIG. 2A has four voltage threshold lobes: 201, 202, 203, and 204. FIG. 2A further shows three voltage thresholds: T0, T1, and T2. To read data from the lower page, the device may use threshold T0. Thresholds T1 and T2 are used to read data from the upper page of the device. The lowermost lobe 201 represents an "erase" state.

FIG. 2B demonstrates the effect of data retention stresses on the exemplary voltage threshold distribution of FIG. 2A. Electron detrapping caused by large elapsed times between programming operations and read operations may cause lobes 202' and 203' to shift leftwards, towards lower voltages. As a consequence, when a read operation is performed on an MLC NAND device subject to data retention stresses using default threshold T1, the result might erroneously read the state of the upper page of the cell to be a '1' when, in actuality, the upper page was programmed to state '0'. Similarly, if the read operation is performed using default threshold T0, the state of the lower page may be erroneously read as a '1' when, in actuality, the lower page was programmed to state '0'.

FIG. 2C demonstrates the effect of read disturb stresses on the exemplary voltage threshold distribution of FIG. 2A. Pass-through voltages applied to cells sharing a common bit line with a cell subject to a read operation cause lobes 201" and 202" to shift rightwards, towards higher voltages. As a consequence, when a read operation is performed on an MLC NAND device subject to data retention stresses using default threshold T1, the result might erroneously read the state of the upper page of the cell to be a '0' when, in actuality, the upper page was programmed to state '1'. Similarly, if the read operation is performed using default threshold T0, the state of the lower page may be erroneously read as a '0' when, in actuality, the lower page was programmed to state '1'.

In order to track and update the read voltage threshold used to read codewords from MLC NAND devices that have been subject to read disturb or data retention stresses, controller 110 of SSD 100 of FIG. 1 comprises a codebook 112, a processor 114, and ECC module 116. Exemplary tracking and updating operations of controller 110 by codebook 112, processor 114, and ECC module 116 are described below with respect to FIGS. 3-9.

FIGS. 3A and 3B illustrate in detail an exemplary codebook 112 for use in such a tracking mechanism. The codebook 112 of FIGS. 3A and 3B may be, in some embodiments, configured for use as the codebook 112 of FIG. 1. As described above, codebook 112 may be stored in controller 110. FIG. 3A represents a history table 302, and FIG. 3B represents a codebook table 304. History table 302 keeps, for each combination block and die of an MLC NAND device, an entry pointing a specific entry in codebook table 304. Codebook table 304 contains up-to-date read thresholds associated with a particular stress for each block. Thus, using codebook 112, the up-to-date read threshold can be selected, from codebook table 304, based on the particular combination of block and die of interest in history table 302. Both of history table 302 and codebook table 304 may be implemented in codebook 112 as look-up tables.

The exemplary codebook 112 of FIGS. 3A and 3B assumes that the MLC NAND system has four NAND dies, each die having 8 blocks. However, the codebook of FIGS. 3A and 3B could be implemented in any configuration of MLC NAND without loss of generality. For the exemplary codebook of FIGS. 3A and 3B, history table 302 is of size 32×4: there are 32 blocks in the exemplary system of the embodiment, and each corresponding entry to the history table has 4 bits. Codebook table 304 has size 16×39: there are 16 entries in the table, each entry corresponding to 3 read thresholds (as described above with respect to FIGS. 2A-2C), and each read threshold corresponds to 13 bits that represents a threshold voltage level ranging from, for example, 0 to 8,192 mV. While the entries of codebook table 304 of FIG. 3B are arranged in ascending order between and within each threshold, any suitable ordering of codebook table entries can be implemented. For a particular entry in codebook 304, {TQ, T1$_j$, T2$_k$}, for 0≤i,j,k,≤3, the content of codebook table 304 is set using a for loop as described by exemplary code:

```
For i=0:3
    For j=0:3
        For k=0:3
            Row(i*4+j*4+k*4) = {T0ᵢ,T1ⱼ,T2ₖ}   (1)
        End for-loop 'k'
    End for-loop 'j'
End for-loop 'i'
```

Implementing the codebook of FIGS. 3A and 3B in controller 110 of SSD 100 allows read thresholds to be tracked and adjusted in response to particular stresses with a low memory footprint. Further, the codebook entries can be updated with a very low complexity.

The entries in codebook table 304 are updated over time in response to ECC statistics of codewords from pages that are read and decoded in standard, functional read flows. The updated entries to codebook table 304 are voltages that, when applied to read commands, return codewords having BERs that are correctable by ECC, as described herein. When a read threshold update trigger indication is asserted by ECC statistics, a new codebook index can be found. The new codebook index may point to an entry in codebook table 304 that provides threshold more appropriate for the actual stress. By updating the entries in codebook table 304 as such, the described embodiments avoid decoding failure events and prevent QoS degradation.

In order for the read voltage thresholds stored in the codebook of FIGS. 3A and 3B to be updated, the stress on each MLC NAND device can be analyzed, and a subsequent adjustment, or offset, to the stored read voltage threshold can be calculated. In particular, the BER corresponding to a codeword read from each block of a particular NAND device in response to a read command can be calculated, and a new threshold voltage can be calculated so as to lower the BER of subsequent codewords read by subsequent read commands executed on the block.

The updated read voltage threshold $VT_{Updated}$ may be calculated based on the stored read voltage threshold $VT_{Stored}$ as described above with respect to FIG. 3B, and the offset $\Delta VT$ in accordance with exemplary formula 2:

$$VT_{update} = VT_{stored} + \Delta VT. \quad (2)$$

The offset $\Delta VT$ may be further calculated in accordance with exemplary formula 3:

$$\Delta VT = 16\Delta T_0 + 4\Delta T_1 + \Delta T_2, \quad (3)$$

where $\Delta T_0$, $\Delta T_1$, and $\Delta T_2$, represent offset values that are equal to 0, 1, or −1, depending on the type and magnitude of the stress to which the MLC NAND device is subject. As explained herein, positive offset values may be implemented when a system is subject to read disturb stress (as read disturb stress has the tendency to increase the voltage of all memory cells), and negative offset values may be implemented when a system is subject to data retention stress (as data retention stress has the tendency to reduce the voltage of all memory cells). For typical magnitudes of read disturb and data retention stress, the offset values used may be of magnitude 1. However, in instances in which the magnitude of the stress on the system is particular large, $\Delta T_0$, $\Delta T_1$, and $\Delta T_2$, may in general be any integer values in proportion to $|P_0-P_1|$, as this value indicates the magnitude of the read threshold shift due to stress on the MLC NAND.

FIGS. 4A-4J demonstrate various different cases of RD and DR stresses, and FIG. 5 describes, for the cases of FIGS. 4B-4G, the impact of the stress on the states of each page, statistical observations for ECC applied to each such page, and the offset values that are used in the calculation of $\Delta VT$.

FIG. 4A again reproduces the exemplary voltage threshold distribution used to read data from an MLC NAND device in the absence of stress.

FIG. 4B demonstrates the effect of RD stress on the system of FIG. 4A. In FIG. 4B, it can be seen that lobe 405 has shifted to the right, relative to unstressed lobe 401 in FIG. 4A. Row 509 of the table in FIG. 5 describes the stress impact, ECC statistical observations, and offset values for calculation of $\Delta VT$ for FIG. 4B. In particular, in the case of FIG. 4B, the lower page of the read block is unaffected (column 506), but data may be erroneously read from the upper page using threshold $T_1$. In particular, a read command executed on an MLC device under the stress of FIG. 4B may return a '0' from the upper page of the block, when in actuality the state was programmed to a '1' (column 508). Reads from the upper page using threshold $T_2$ are unaffected (column 510). For the lower page, the BER is low ("L", column 512) and, as such, there is a small probability that, for the lower page, any data will be erroneously read (column 514). However, there is a high probability ("H", column 516) that data will be erroneously read from the upper page. In particular, ECC will detect more '1's erroneously read as '0's ("$P_0$") than it will '0's erroneously read as '1's ("$P_1$"). Accordingly, for the upper page in the case of FIG. 4B, $P_0>P_1$ (column 518). Finally, for the case of FIG. 4B, because the erroneous reads arise from the voltage threshold increasing beyond threshold $T_1$, the updated read voltage threshold should be increased to prevent such errors. Accordingly, the offset $\Delta VT$ is computed using a value of 1 for $\Delta T_1$.

FIG. 4C demonstrates another effect of RD stress on the system of FIG. 4A. In FIG. 4C, it can be seen that both lobes 409 and 410 have shifted to the right, relative to unstressed lobes 401 and 402 in FIG. 4A. Row 511 of the table in FIG. 5 describes the stress impact, ECC statistical observations, and offset values for calculation of $\Delta VT$ for FIG. 4C. In particular, in the case of FIG. 4C, data may be erroneously read from the lower page using threshold $T_0$. A read command executed on an MLC device under the stress of FIG. 4C may return a '0' from the lower page of the block when the page was programmed to a '1' (column 506). Further, a read command executed using threshold $T_1$ may also return a '0' from the upper page of the block when the page was programmed to a '1' (column 508). Reads from the upper page using threshold $T_2$ are unaffected (column 510). For the lower page, the BER is high ("H", column 512) and, ECC will detect more '1's erroneously read as '0's ("$P_0$") than it will '0's erroneously read as '1's ("$P_1$"). Accordingly, for the lower page in the case of FIG. 4C, $P_0>P_1$ (column 514). Further, there is a high probability ("H", column 516) that data will be erroneously read from the upper page. In particular, ECC will detect more '1's erroneously read as '0's ("$P_0$") than it will '0's erroneously read as '1's ("$P_1$"). Accordingly, for the upper page in the case of FIG. 4C, $P_0>P_1$ (column 518). Finally, for the case of FIG. 4C, because the erroneous reads arise from voltage thresholds increasing beyond thresholds $T_0$ and $T_1$, both such thresholds need to be positively shifted, and the offset $\Delta VT$ is computed using a value of 1 for both $\Delta T_0$ and $\Delta T_1$.

FIG. 4D demonstrates a third case of RD stress on the system of FIG. 4A. In FIG. 4D, lobes 413, 414, and 415 have shifted to the right, relative to unstressed lobes 401, 402, and 403 in FIG. 4A. Row 513 of the table in FIG. 5 describes the stress impact, ECC statistical observations, and offset values for calculation of $\Delta VT$ for FIG. 4D. In particular, in the case of FIG. 4C, data may be erroneously read from the lower page using threshold $T_0$. A read command executed on an MLC device under the stress of FIG. 4C may return a '0' from the lower page of the block when the page was programmed to a '1' (column 506). Further, a read command executed using threshold $T_1$ may also return a '0' from the upper page of the block when the page was programmed to a '1' (column 508). Finally, for large enough RD stress, a read command executed using threshold $T_2$ may return a '1' from the upper page of the block when the page was programmed to a '0' (column 510). For both pages, BER is high ("H", columns 512 and 516). For the lower page, ECC will detect more '1's erroneously read as '0's ("$P_0$") than it will '0's erroneously read as '1's ("$P_1$"). Accordingly, for the lower page in the case of FIG. 4D, $P_0>P_1$ (column 514). In the upper page, because both read thresholds $T_1$ and $T_2$ are affected by the RD stress of FIG. 4D, '1's and '0's will be erroneously read with a roughly similar frequency. Thus, $P_0 \approx P_1$ (column 518). Finally, for the case of FIG. 4D, because the erroneous reads arise from voltage thresholds increasing beyond all thresholds, all thresholds need to be positively shifted, and the offset $\Delta VT$ is computed using a value of 1 for each of $\Delta T_0$, $\Delta T_1$, and $\Delta T_2$.

Figure 4E:
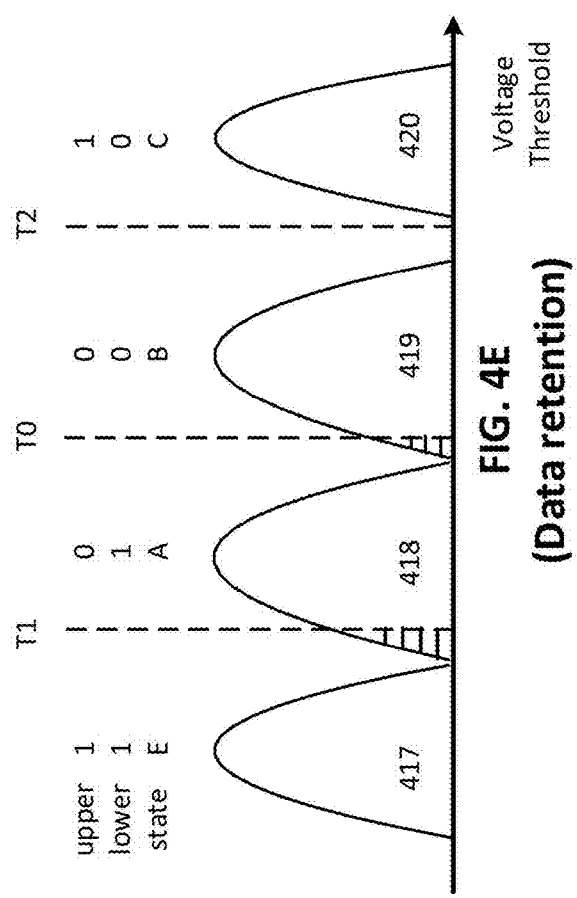

FIG. 4E demonstrates an effect of DR stress on the system of FIG. 4A. In FIG. 4E, it can be seen that both lobes 418 and 419 have shifted to the left, relative to unstressed lobes 402 and 403 in FIG. 4A. Row 515 of the table in FIG. 5 describes the stress impact, ECC statistical observations, and offset values for calculation of $\Delta VT$ for FIG. 4E. In particular, in the case of FIG. 4E, data may be erroneously read from the lower page using threshold $T_0$. A read command executed on an MLC device under the stress of FIG. 4E may return a '1' from the lower page of the block when the page was programmed to a '0' (column 506). Further, a read command executed using threshold $T_1$ may also return a '1' from the upper page of the block when the page was programmed to a '0' (column 508). Reads from the upper page using threshold $T_2$ are unaffected (column 510). For the lower page, the BER is high ("H", column 512) and, ECC will detect more '0's erroneously read as '1's ("$P_1$") than it will '1's erroneously read as '0's ("$P_0$"). Accordingly, for the lower page in the case of FIG. 4E, $P_0<P_1$ (column 514). Further, there is a high probability ("H", column 516) that data will be erroneously read from the upper page. In particular, ECC will detect more '0's erroneously read as '1's ("$P_1$") than it will '1's erroneously read as '0's ("$P_0$"). Accordingly, for the upper page in the case of FIG. 4E, $P_0<P_1$ (column 518). Finally, for the case of FIG. 4E, because the erroneous reads arise from voltage thresholds decreasing beyond thresholds $T_0$ and $T_1$, both such thresholds need to be negatively shifted, and the offset $\Delta VT$ is computed using a value of $-1$ for both $\Delta T_0$ and $\Delta T_1$.

Figure 4F:
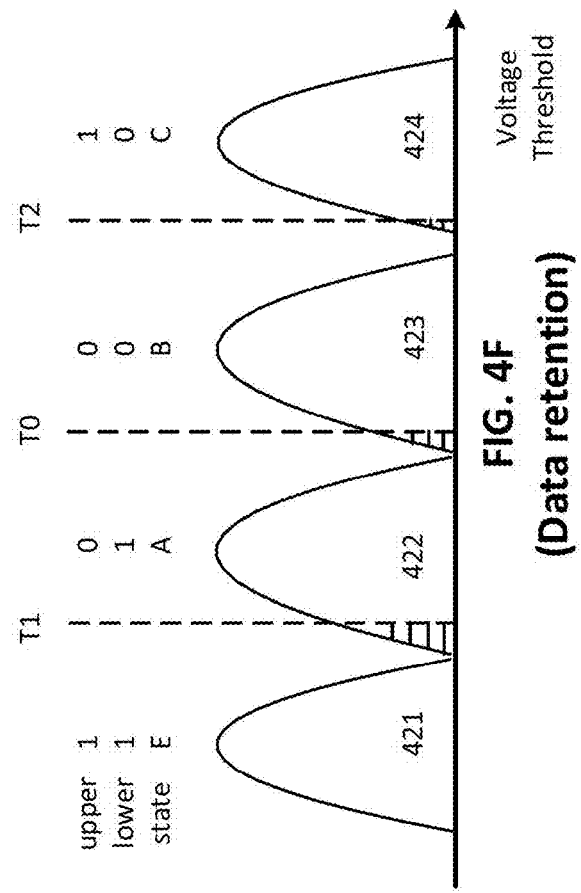

FIG. 4F demonstrates another effect of DR stress on the system of FIG. 4A. In FIG. 4F, it can be seen that lobes 422, 423, and 424 have shifted to the left, relative to unstressed lobes 402, 403, and 404 in FIG. 4A. Row 517 of the table in FIG. 5 describes the stress impact, ECC statistical observations, and offset values for calculation of ΔVT for FIG. 4F. In particular, in the case of FIG. 4F, data may be erroneously read from the lower page using threshold $T_0$. A read command executed on an MLC device under the stress of FIG. 4F may return a '1' from the lower page of the block when the page was programmed to a '0' (column 506). Further, a read command executed using threshold $T_1$ may also return a '1' from the upper page of the block when the page was programmed to a '0' (column 508). A read command executed using threshold $T_2$ may return a '0' from the upper page of the block when the page was programmed to a '1' (column 510). For the lower page, the BER is high ("H", column 512) and, ECC will detect more '0's erroneously read as '1's ("$P_1$") than it will '1's erroneously read as '0's ("$P_0$"). Accordingly, for the lower page in the case of FIG. 4F, $P_0 < P_1$ (column 514). Further, there is a high probability ("H", column 516) that data will be erroneously read from the upper page. In the upper page, because both read thresholds $T_1$ and $T_2$ are affected by the DR stress of FIG. 4F, '1's and '0's will be erroneously read with a roughly similar frequency. Thus, $P_0 \approx P_1$ (column 518). Finally, for the case of FIG. 4F, because the erroneous reads arise from each voltage threshold decreasing beyond the default thresholds, each threshold needs to be negatively shifted, and the offset ΔVT is computed using a value of −1 for $\Delta T_0$, $\Delta T_1$, and $\Delta T_2$.

Figure 4G:
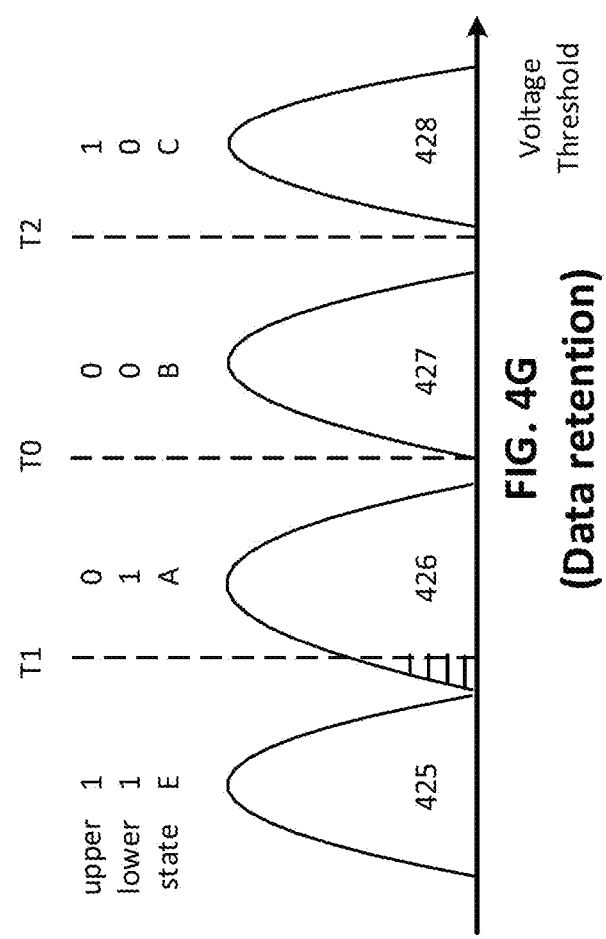

FIG. 4G demonstrates another effect of DR stress on the system of FIG. 4A. In FIG. 4G, it can be seen that lobe 426 has shifted to the left, relative to unstressed lobe 402 in FIG. 4A. Row 519 of the table in FIG. 5 describes the stress impact, ECC statistical observations, and offset values for calculation of ΔVT for FIG. 4G. In particular, in the case of FIG. 4G, reads from the lower page of the MLC NAND device are unaffected (column 506). However, a read command executed using threshold $T_1$ may return a '1' from the upper page of the block when the page was programmed to a '0' (column 508). A read command executed on the upper page of the MLC NAND device using threshold $T_2$ will also be unaffected (column 510). For the lower page, the BER is low ("L", column 512) and, there is a small probability that ECC will erroneous bits (column 514). However, there is a high probability ("H", column 516) that data will be erroneously read from the upper page. For the upper page, because ECC will detect more '0's erroneously read as '1's ("$P_1$") than it will '1's erroneously read as '0's ("$P_0$"), $P_0 < P_1$ (column 518). Finally, for the case of FIG. 4G, because the erroneous reads arise from the voltage threshold decreasing beyond threshold $T_1$, the offset ΔVT is computed using a value of −1 for $\Delta T_1$.

Figure 4H:
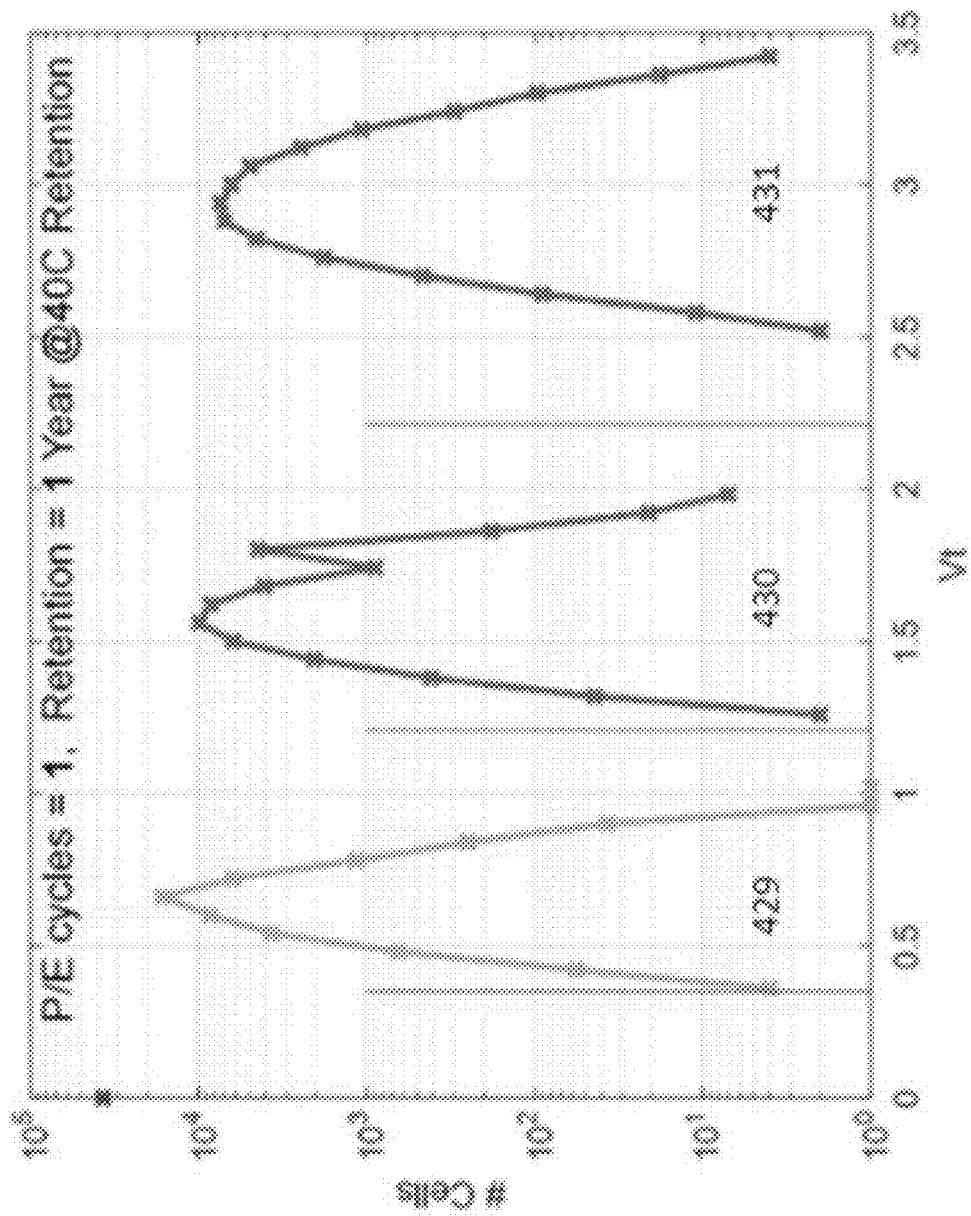
FIGS. 4H-4J illustrate data showing the effect of various stresses on read voltage threshold distributions.
Figure 4I:
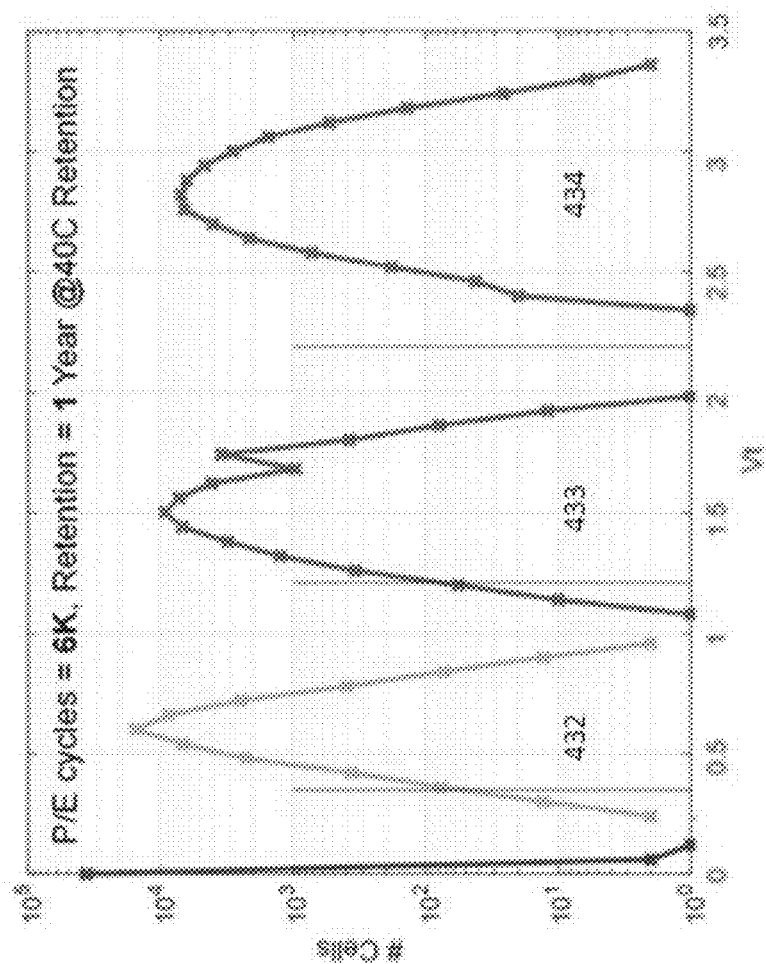
Figure 4J:
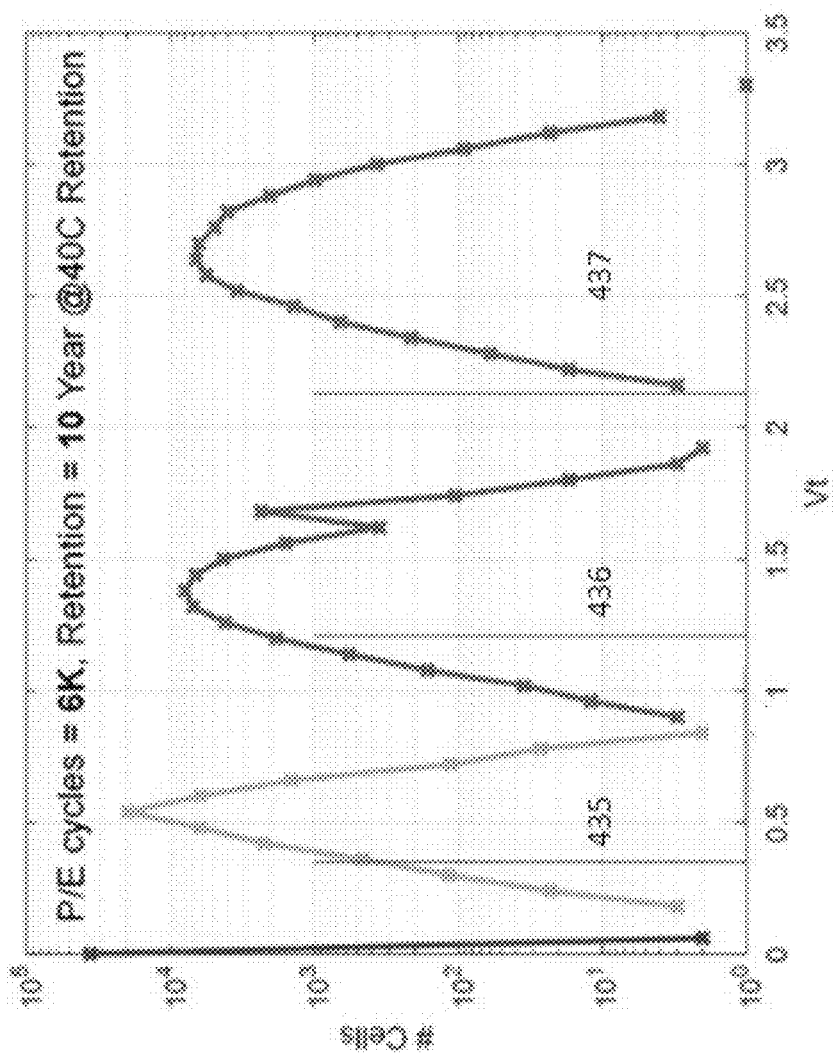

FIG. 4H demonstrates data taken of a voltage threshold distribution from a SSD subject to one year of data retention stress and one program/erase cycle. It can be observed that reading this page with default read voltage thresholds provides no errors, as none of lobes 429, 430, or 431 shift past the delineated thresholds marked by vertical lines. FIG. 4I demonstrates data taken of a voltage threshold distribution from a SSD subject to 1 year of data retention and 6,000 program/erase cycles. It can be observed that reading this page with default read voltage thresholds provides several errors both in the lower and upper pages, as lobes 432 and 433 shift past the delineated thresholds. This scenario is similar to that described in FIG. 4E, with a moderate magnitude of | $P_0 - P_1$ |. The errors demonstrated in FIG. 4I may result an offset of magnitude '1'. FIG. 4J demonstrates data taken of a voltage threshold distribution from a SSD subject to 10 years of data retention stress and subject to 6,000 program/erase cycles. Reading this page with default read voltage thresholds provides several errors both in the lower and upper pages, as lobes 435 and 436 shift past the delineated thresholds. This scenario is again similar to that described in FIG. 4E, with a high magnitude of | $P_0 - P_1$ |. The errors demonstrated in FIG. 4J may result in offset values of magnitude '2'.

Figure 6:
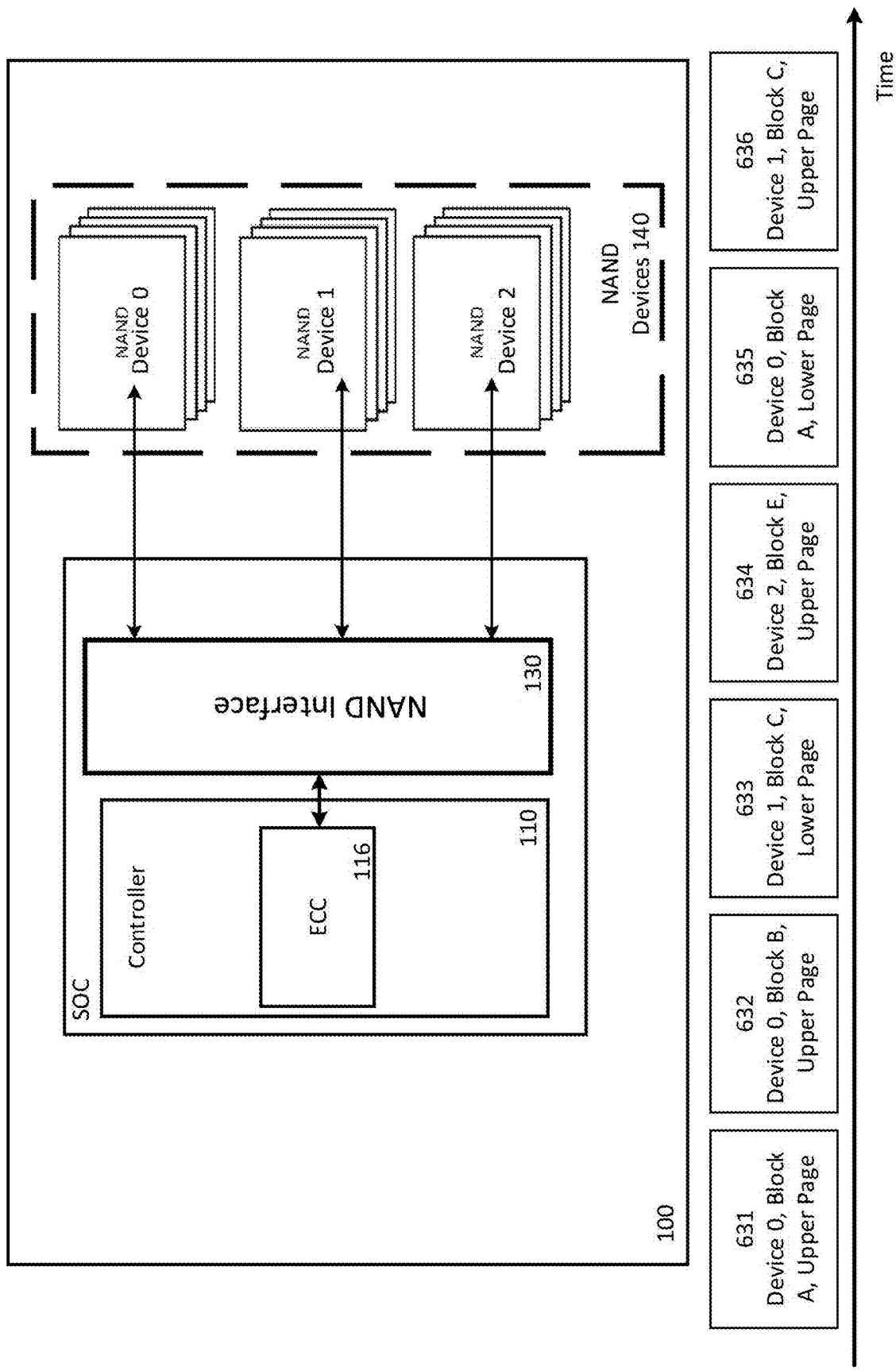
FIG. 6 illustrates an exemplary SSD processing read commands to several NAND devices in parallel according to one or more embodiments of the disclosure.

FIG. 6 illustrates an embodiment of a SSD 100 in which the codewords based on which ECC statistics are computed arrive sequentially to the ECC module 116 from NAND devices 140 from different blocks and dies, rather than sequentially from the same block, page-by-page in order. This may occur in cases in which the controller 110 is processing many read commands issued from a host (not illustrated) in parallel.

In the embodiment of FIG. 6, controller 110 in which ECC module 116 is stored, is, via NAND interface 130, in communication with three NAND devices 140: NAND device 0, NAND device 1, and NAND device 2. The controller 110 may process read commands to each NAND device in parallel. As a consequence, as shown along the time axis at the bottom of FIG. 6, the first codeword 631 to arrive at ECC module 116 is based on data read from the upper page of block A of NAND device 0. Codeword 631 is followed by codeword 632 (upper page of block B of NAND device 0), 633 (lower page of block C of NAND device 1), and 634 (upper page of block E of NAND device 2). It is not until codeword 635 (lower page of block A of NAND device 0) arrives at ECC module 116 that ECC module can compute statistics for a complete block of any of NAND devices 640. For this reason, it is desirable to allow the ECC module to track statistics of several MLC NAND blocks at once. This allows for the thresholds of any relevant block to be continually tracked and updated in accordance with any of the embodiments described herein.

Figure 7:
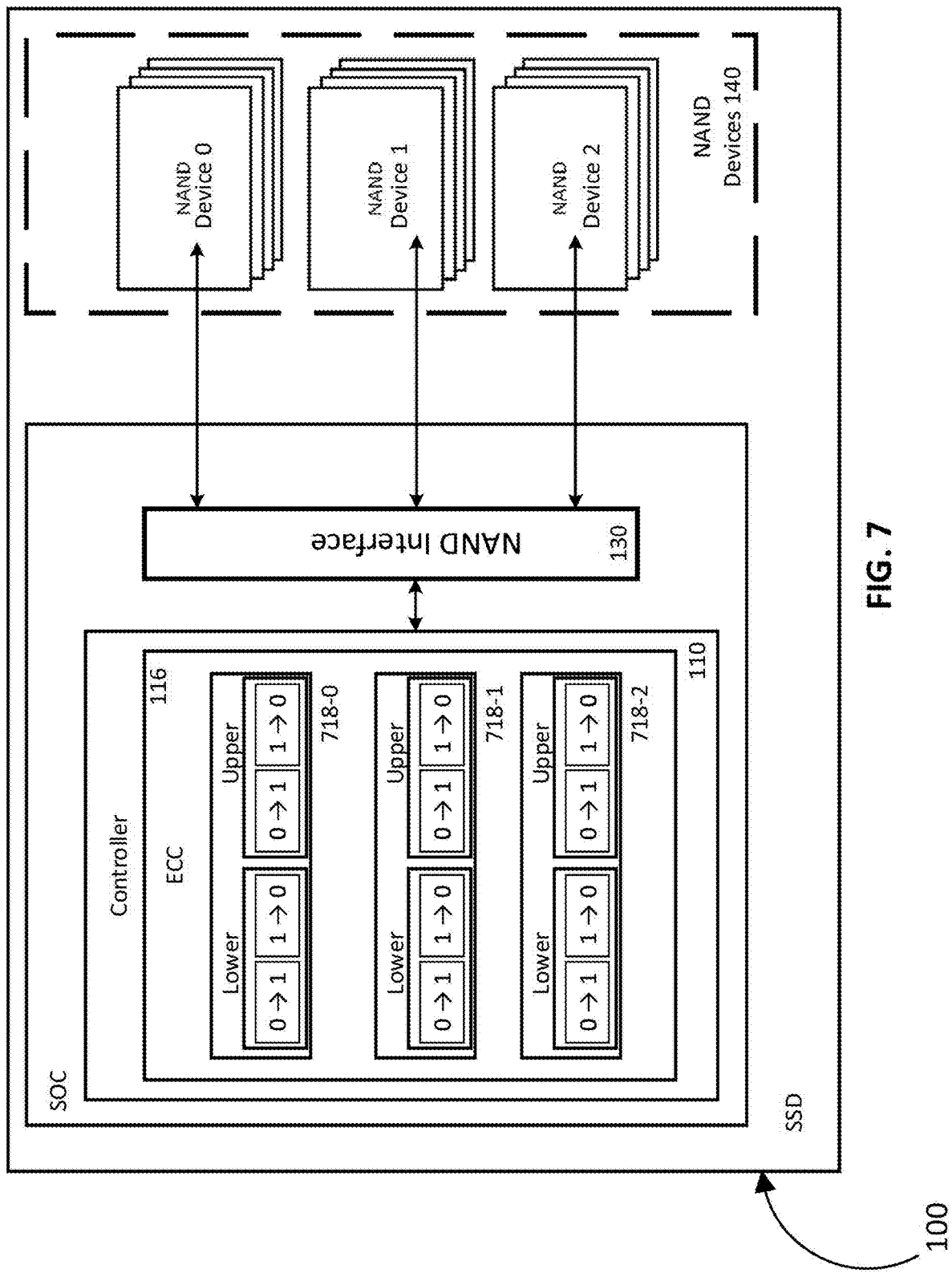
FIG. 7 illustrates an exemplary SSD configured to store ECC statistics for multiple blocks of multiple NAND devices according to one or more embodiments of the disclosure.

FIG. 7 describes an embodiment of an SSD 100 in which ECC module 116 tracks statistics for each of NAND device 0, NAND device 1, and NAND device 2. In particular, statistics 718-0 reflect the erroneous reads for both the upper and lower pages of blocks in NAND device 0. Statistics 718-1 reflect the erroneous reads for both the upper and lower pages of blocks in NAND device 1. Statistics 718-2 reflect the erroneous reads for both the upper and lower pages of blocks in NAND device 2. By maintaining statistics for several NAND devices as shown in FIG. 7, the read thresholds for the blocks of each device can be tracked and updated with time in order to prevent burdensome read retry flows from being invoked and to improve system efficiency.

Figure 8:
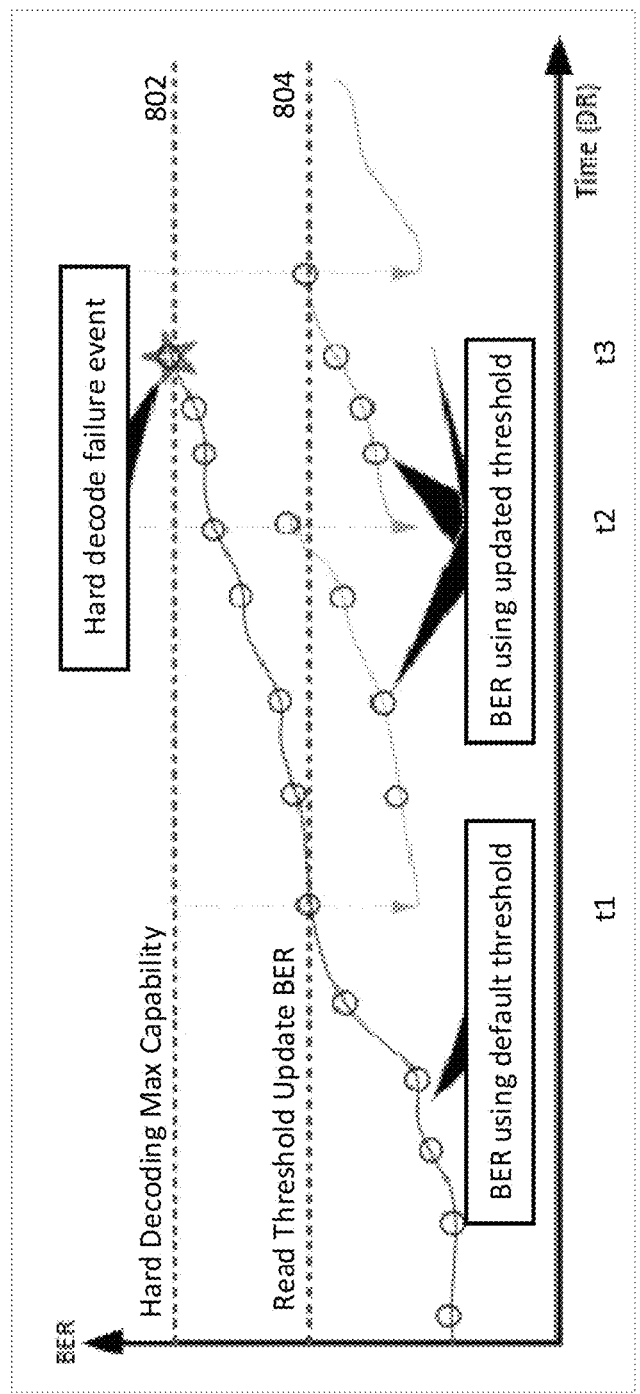
FIG. 8 illustrates the relationship between BER and time for the case of an SSD using default read thresholds and for the case of an SSD using the tracking and updating methods according to one or more embodiments of the disclosure.

FIG. 8 illustrates a graph of BER versus time for cases in which a controller of an SSD reads data using default read thresholds (top line) and in which a controller of an SSD reads data using read thresholds that are tracked and adjusted over time in accordance with the embodiments described herein (bottom lines). FIG. 8 illustrates a case in which the SSDs are subject to data retention stress. Each circle in FIG. 8 represents an issued read command. Horizontal line 802 represents a value of the BER which, if calculated for a codeword read from a NAND device in response to a read command, results in a hard decode failure event. Horizontal line 804 represents a threshold BER which, if encountered, triggers a readjustment of the read voltage threshold in accordance with any one of the embodiments described herein. The threshold 804 may be selected in certain embodiments based on the configuration of the SSD system and the stress to which it is expected to be subject. Subsequent read commands issued with the updated threshold have lower BERs and, consequently, avoid hard decode failure events.

Prior to time t1 in FIG. 8, read commands are issued and corresponding BERs are calculated according to any of the embodiments described herein. At time t1 in FIG. 8, the read command returns codeword having a corresponding BER, as determined by ECC, that lies on the threshold defined by line 804. A system programmed with default read voltage thresholds makes no adjustment to its read voltage thresholds in response to encountering the threshold BER of line 804. Such a system issues a subsequent read command after time t1 that returns an even larger BER, as shown by the top line in FIG. 8. On the other hand, a system configured to implement the tracking and updating mechanisms as described by the embodiments herein adjusts its read voltage threshold in response to encountering the BER of threshold 804 (bottom line). The next read commands issued by such a system uses this adjusted voltage threshold and, consequently, return codewords with corresponding BERs that lie below threshold 804.

At time t2, another read command is issued. The BER of the default read voltage threshold system (top line) continues to increase and approaches line 802, corresponding to the BER that yields a hard decode failure event. The BER of the system using updated read voltage thresholds (bottom line) again exceeds the BER threshold defined by line 804. The system using updated thresholds once more adjusts the read voltage threshold in response to having encountered the BER defined by threshold 804, and uses this threshold for subsequent reads until the threshold 804 is again encountered.

At time t3, another read command is issued. The resultant BER is, for the system using default read voltage thresholds (top line), sufficiently large so as to trigger a hard decode failure event. Subsequently, the system using the default read voltage thresholds issues a read retry flow, resulting in a QoS penalty. On the other hand, the system using updated read voltage thresholds (bottom line), has adjusted its read voltage threshold so that the read command issued at time t3 returns a codeword having a corresponding BER, as determined by ECC, that lies below the threshold 804. It is thus seen that by adjusting the read threshold voltage in accordance with the embodiments described herein, the system of FIG. 8 using updated read voltage thresholds continues to be able to issue read commands without encountering a BER corresponding to a hard decode failure event.

Figure 9:
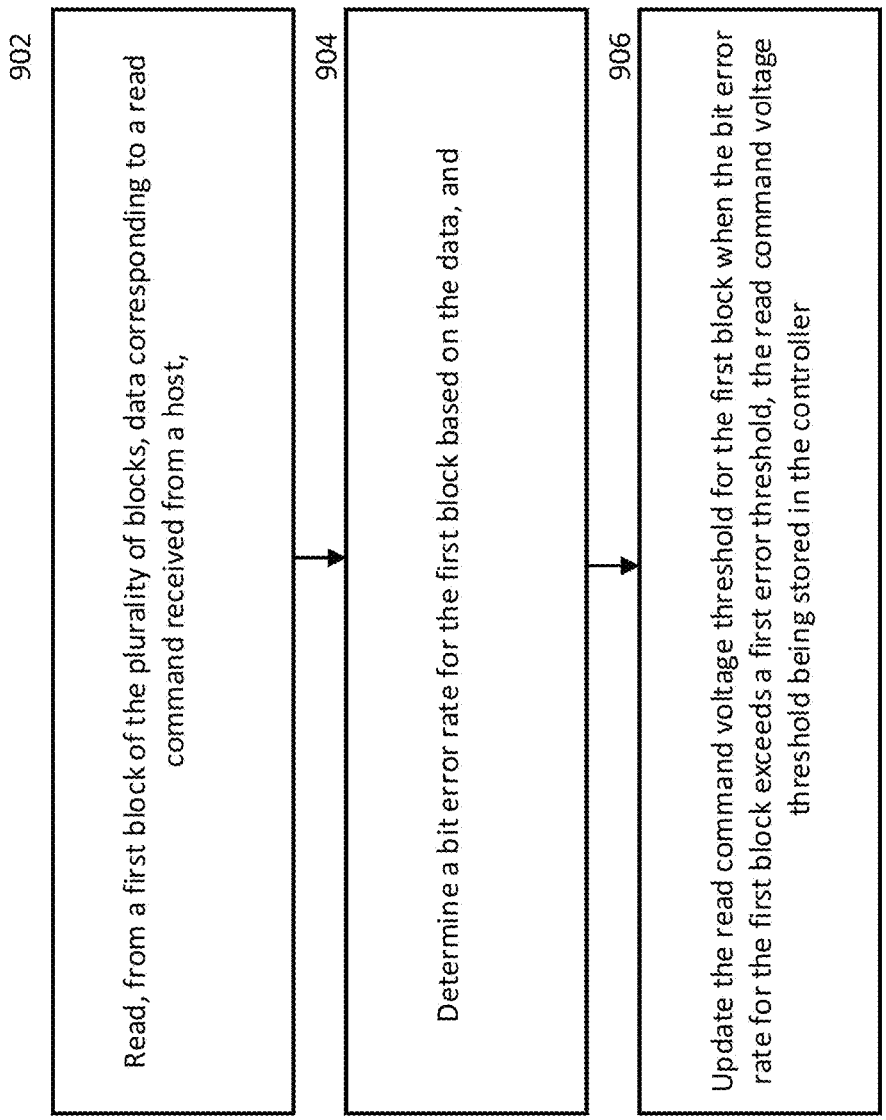
FIG. 9 illustrates a flowchart illustrating the tracking and updating methods according to one or more embodiments of the disclosure.

FIG. 9 illustrates a flowchart describing a method implemented by a controller of an SSD in accordance with the embodiments described herein. In certain embodiments, the controller of the SSD is in communication with a plurality of nonvolatile memory devices, each comprising a multi-level memory cell, each such memory cell comprising a plurality of blocks.

In FIG. 9, at step 902, a controller reads, from a first block of a plurality of blocks, data corresponding to a read command received from a host. In step 904, the controller subsequently determines a bit error rate for the first block based on the data read in response to the read command. In step 906, the controller updates the read voltage threshold for the first block when the bit error rate for the first block exceeds a first error threshold. The controller may update the read voltage threshold by calculating an offset to add to a currently stored read voltage threshold, in accordance with exemplary equation 3 and a corresponding description provided above. The updated read voltage threshold is stored within the codebook in the controller in place of the currently stored read voltage threshold, and is used for subsequent read operations from the block in order to reduce the BER of subsequent reads.

In the foregoing, it should be noted that the term "roughly" indicates a set of values within +20% of each other. Other objects, advantages and embodiments of the various aspects of the present invention will be apparent to those who are skilled in the field of the invention and are within the scope of the description and the accompanying drawings. For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A method performed by a controller of a non-volatile memory device for adjusting a read voltage threshold used to read data from a plurality of memory dies of the non-volatile memory device in communication with the controller, each of the memory dies comprising a plurality of blocks, the method comprising:
reading, from a first block of the plurality of blocks, data corresponding to a read command received from a host;
determining a bit error rate for the first block based on the data; and
updating the read voltage threshold for the first block when the bit error rate for the first block exceeds a first error threshold, the read voltage threshold being stored in the controller.

2. The method of claim 1, further comprising determining a bit error rate for each of an upper page and a lower page of the first block.

3. The method of claim 1, wherein the controller reads a codeword from the first block of the plurality of blocks, and wherein the method further comprises decoding the codeword via error correcting code (ECC) to determine the bit error rate for the first block.

4. A method performed by a controller of a non-volatile memory device for adjusting a read voltage threshold used to read data from a plurality of memory dies of the non-volatile memory device in communication with the controller, each of the memory dies comprising a plurality of blocks, the method comprising:
reading, from a first block of the plurality of blocks, data corresponding to a read command received from a host;
determining a bit error rate for the first block based on the data; and
updating the read voltage threshold for the first block when the bit error rate for the first block exceeds a first error threshold, the read voltage threshold being stored in the controller,
wherein updating the read voltage threshold stored in the controller comprises calculating an offset voltage to add to the read voltage threshold.

5. The method of claim 1, wherein the controller is further configured to store the read voltage threshold in a codebook in the controller.

6. The method of claim 5, wherein the codebook is accessible by a lookup table stored in the controller.

7. The method of claim 1, further comprising determining a bit error rate for at least a second block of the plurality of blocks.

8. The method of claim 7, further comprising storing, in the controller, ECC statistics for the first block and for the second block.

9. The method of claim 7, further comprising updating a read voltage threshold stored in the controller for the second block when the bit error rate for the second block exceeds a second error threshold.

10. The method of claim 1, wherein determining the bit error rate includes collecting error correction code (ECC) statistics from a decoding operation performed in connection with the read command from the host.

11. A non-volatile memory device comprising:
- a plurality of memory dies, each of the memory dies comprising a plurality of blocks; and
- a controller coupled to the plurality of memory dies, the controller configured to:
  - read, from a first block of the plurality of blocks, data corresponding to a read command received from a host,
  - determine a bit error rate for the first block based on the data, and
  - update a read voltage threshold for the first block when the bit error rate for the first block exceeds a first error threshold, the read voltage threshold being stored in the controller.

12. The non-volatile memory device of claim 11, wherein the controller is further configured to determine a bit error rate for each of an upper page and a lower page of the first block.

13. The nonvolatile memory device of claim 11, wherein the controller is further configured to:
- read a codeword from the first block of the plurality of blocks, and
- decode the codeword via error correcting code (ECC) to determine the bit error rate for the first block.

14. The non-volatile memory device of claim 11, wherein the controller is further configured to update the read voltage threshold stored in the controller by calculating an offset voltage to add to the read voltage threshold.

15. The non-volatile memory device of claim 11, wherein the controller is further configured to store the read voltage threshold in a codebook in the controller.

16. The non-volatile memory device of claim 15, wherein the codebook is accessible by a lookup table stored in the controller.

17. The non-volatile memory device of claim 11, wherein the controller is further configured to determine a bit error rate for at least a second block of the plurality of blocks.

18. The non-volatile memory device of claim 17, wherein the controller is further configured to store, in the controller, ECC statistics for the first block and for the second block.

19. The non-volatile memory device of claim 17, wherein the controller is further configured to update a read voltage threshold stored in the controller for the second block when the bit error rate for the second block exceeds a second error threshold.

20. The non-volatile memory device of claim 11, wherein the memory dies are multi-level cell NAND memory dies.

* * * * *